(12) United States Patent
Havens

(10) Patent No.: US 6,462,548 B1
(45) Date of Patent: Oct. 8, 2002

(54) OPEN ARCHITECTURE MAGNETIC RESONANCE SUPERCONDUCTING PLATFORM MAGNET CONICAL IMAGING

(75) Inventor: Timothy John Havens, Florence, SC (US)

(73) Assignee: GE Medical Systems Global Technology Company, Waukesha, WI (US)

( * ) Notice: Subject to any disclaimer, the term of this patent is extended or adjusted under 35 U.S.C. 154(b) by 0 days.

(21) Appl. No.: 09/902,364

(22) Filed: Jul. 9, 2001

(51) Int. Cl.⁷ .................................................. G01V 3/00
(52) U.S. Cl. ........................ 324/318; 324/319; 324/309
(58) Field of Search ............................... 324/318, 319, 324/320, 307, 309; 335/299, 296, 216; 128/653

(56) References Cited

U.S. PATENT DOCUMENTS

| | | | | |
|---|---|---|---|---|
| 4,689,591 A | * | 8/1987 | McDougall | 335/299 |
| 5,134,374 A | * | 7/1992 | Breneman | 324/319 |
| 5,382,904 A | * | 1/1995 | Pissanetzky | 324/319 |
| 5,436,607 A | * | 7/1995 | Chari et al. | 335/216 |
| 5,463,364 A | * | 10/1995 | Muller | 335/299 |
| 5,675,305 A | * | 10/1997 | DeMeester et al. | 335/316 |
| 5,801,609 A | * | 9/1998 | Laskaris et al. | 335/216 |
| 5,977,771 A | * | 11/1999 | Petropoulos | 324/318 |
| 6,147,578 A | * | 11/2000 | Panfil et al. | 335/295 |
| 6,157,278 A | * | 12/2000 | Ketznelson et al. | 335/296 |
| 6,163,240 A | * | 12/2000 | Zuk et al. | 335/299 |
| 6,335,623 B1 | * | 1/2002 | Damadian et al. | 325/320 |

\* cited by examiner

Primary Examiner—Edward Lefkowitz
Assistant Examiner—Brij B. Shrivastav
(74) Attorney, Agent, or Firm—Irving M. Freedman; Michael A. Della Penna; Christian Cabou

(57) ABSTRACT

An open architecture platform superconducting magnet for international procedures with a shaped yoke assembly and associated magnet coil and with a patient support positioned above the magnet coil, and a magnetic field imaging volume which is conically shaped with a cross section which decreases in size remote from the coil.

20 Claims, 2 Drawing Sheets

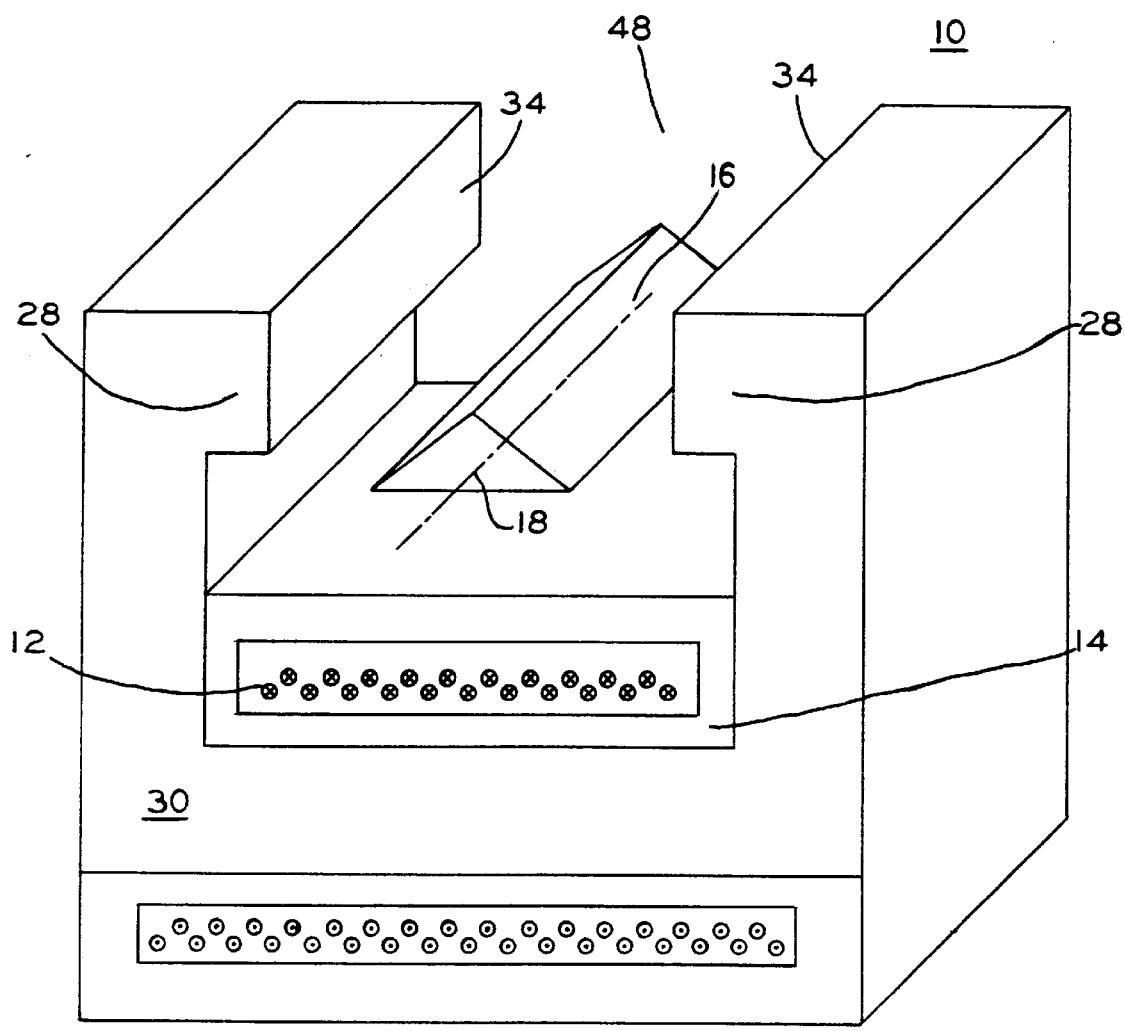
FIG_1
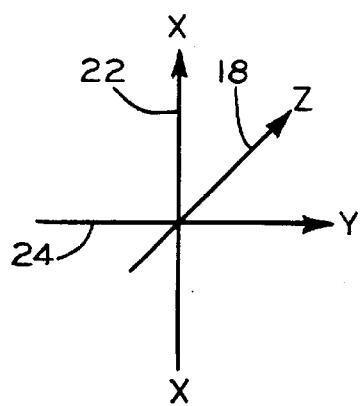
FIG_2

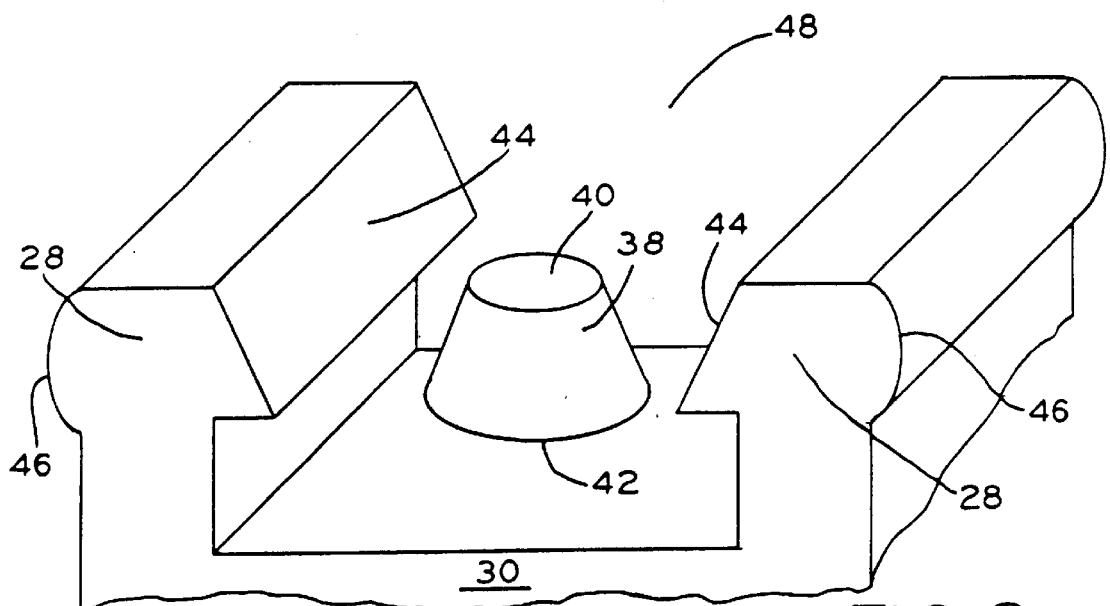
FIG_3
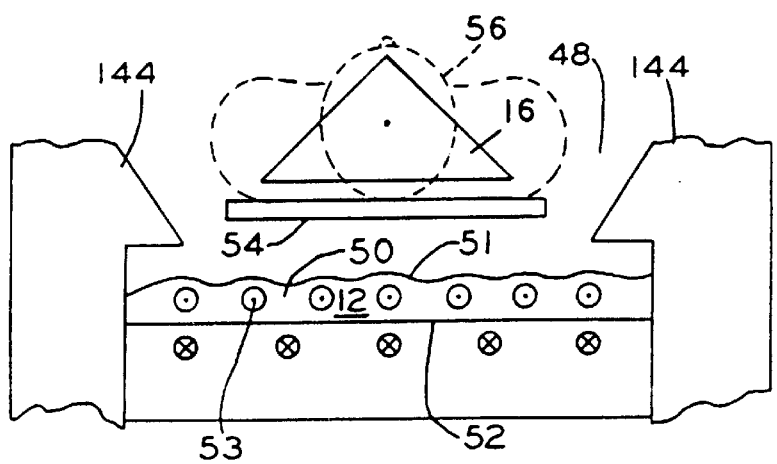
FIG.4
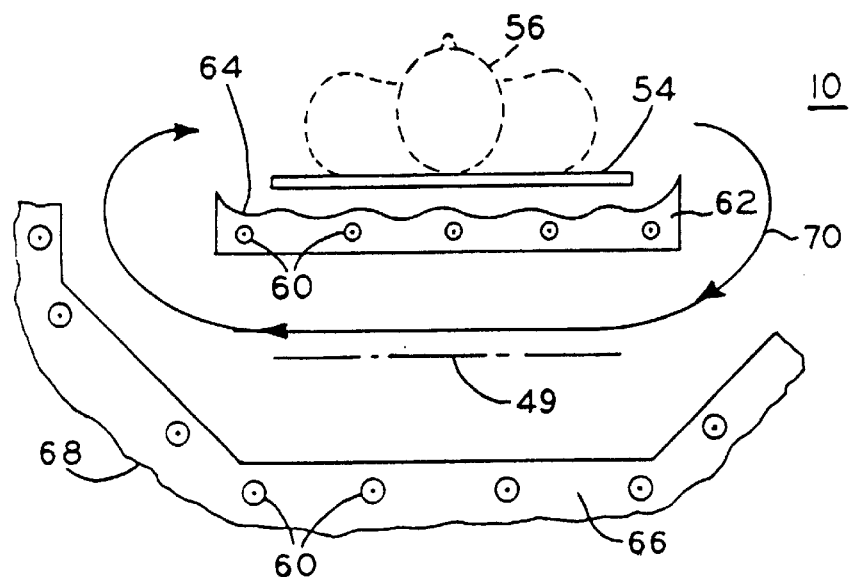
FIG_5

US 6,462,548 B1

OPEN ARCHITECTURE MAGNETIC REASONANCE SUPERCONDUCTING PLATFORM MAGNET CONICAL IMAGING

BACKGROUND OF INVENTION

This invention relates to an open architecture superconducting magnet assembly for a magnetic resonance imaging system (hereinafter called "MRI"), and more particularly to a magnet assembly utilizing a conical or prism shaped imaging region and suitable for interventional surgical procedures.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the magnet coils for a period (for example, of only ten minutes) to introduce a current flow through the coils, the current will continue to flow through the coils even after power is removed due to the absence of electrical resistance at the superconducting temperature, thereby maintaining a strong magnetic field. Superconducting magnets find wide application in the field of MRI.

A problem encountered in the use of most MRI equipment is that they utilize solenoidal magnets enclosed in cylindrical structures with a central bore opening for patient access. However, in such an arrangement, the patient is practically enclosed in the warm central bore, which can induce claustrophobia in some patients. Moreover, there has been a desire to utilize MRI for interventional diagnostic or surgical procedures such that the surgeon can observe the imaging during the procedure. The desirability of an open architecture MRI magnet in which the patient is not essentially totally enclosed has thus long been recognized. Unfortunately, an open architecture MRI magnet to provide open space about the patient poses a number of additional and unique technical problems and challenges. One problem is to provide a suitable superconducting structure which will provide the required magnetic field yet occupies much less space than conventional cylindrical MRI magnet structures, and yet which nevertheless can provide the required strong and homogeneous magnetic field imaging region or imaging volume.

Existing open architecture designs include double donut and double iron pole pieces with intervening support members with the patient positioned between the donuts. However, while providing patient access, such a design limits surgeon access because of the required supports and double magnetic members. As a result access to the patient is limited in such designs which are not as amenable to medical interventional and surgical procedures as desired.

The constraints on mechanical and magnetic subassemblies in a superconducting magnet are driven by the need to provide a suitable homogeneous and strong imaging region usually midway between the magnetic members in which to do the actual MRI imaging. A typical MRI imaging region is a sphere 15 to 20 inches in diameter, or a cylindrical imaging volume 10 to 15 inches in diameter and 10 to 20 inches long. The use of symmetrical or mirror image magnetic components about the imaging volume with magnetic shaping and positionable shimming members have enabled the adjustment or fine tuning of the resultant magnetic field to provide a spherical or cylindrical volume imaging volume with the required magnetic homogeneity.

For interventional procedures, it has been determined that a spherical or cylindrical imaging region or volume is not necessary. A smaller imaging or viewing region at the point where the surgical procedure or needle insertion begins on the surface of the body of the patient can readily utilize a smaller imaging volume which is not a spherical or cylindrical volume. It may even be desirable for such procedures to have the imaging volume increase as it penetrates into the body away from the point where the surgery begins, that is a generally conical imaging volume. Moreover., it is highly desirable and often necessary to provide a flexible design which facilitates construction while minimizing cost of the MRI equipment.

BRIEF SUMMARY OF INVENTION

It is thus desirable to provide an open architecture MRI superconducting magnet in which the patient is as fully accessible to the physician as possible and which includes a spherical or prismatic imaging volume.

In accordance with one form of the invention an open architecture platform superconducting magnet suitable for interventional procedures includes shaped magnetic yoke and associated magnet coil. The yoke and coil are shaped to provide an imaging region in open space above the coil which is tapered, in that the cross section of the imaging volume decreases in the direction remote from the coil. The tapered imaging region is in the shape of a frustrum of a right cone or a prism. A patient support is positioned above the magnet coil and magnet coil axis. The magnetic field may have a monotonic gradient.

BRIEF DESCRIPTION OF DRAWINGS

FIG. 1 is a simplified cutaway perspective view of an MRI magnet illustrating an enlarged prism shaped imaging volume with the imaging volume exaggerated and positioned for ease of illustration.

FIG. 2 shows the X, Y and Z orthogonal axes of the imaging volume.

FIG. 3 shows a conical imaging volume and shaped magnetic poles suitable for use with the embodiments of FIG. 1 or FIG. 3.

FIGS. 4 and 5 illustrate other aspects of the invention with the imaging volume also shown in solid lines for ease of disclosure, and FIG. 4 best illustrating the position of the imaging volume in the MRI magnet.

DETAILED DESCRIPTION OF THE PREFERRED EMBODIMENT

Referring first to FIGS. 1 and 2, superconducting magnet 10 includes a plurality of superconducting coils such as 12 in a helium vessel 14 to provide a magnetic field perpendicular to axis 18 between magnet poles 28 in the manner well known in the art.

FIG. 2 illustrates the imaging axes X, Y and Z of superconducting magnet 10. X is vertical axis 22, Y is horizontal axis 24, while Z is orthogonal axis 18 which extends into space 26 between opposed poles 28 of yoke assembly 30. Patient support 54 (shown in FIG. 4) extends parallel to axis Y or axis Z in space 48 between opposed magnet poles 28 such that the patient can lie along either axis depending on convenience or superconducting magnet 10 dimensions. As best shown in FIG. 1, yoke assembly 30 includes planar poles 28 and pole surfaces 34. However, additional iron can be added in the Y and Z directions which may be shaped to be of varying thicknesses as described below and/or the opposed pole surfaces 34 of poles 28 can be shaped to control the shape of imaging volume 16 and also the homogeneity of the magnetic field in imaging volume 38. In addition, magnet coils such as 12 may be wound to form a non-cylindrical coil in order to vary and control the current density or pattern of the current flow through the coils in order to achieve maximum homogeneity at minimum cost.

Another suitable and desirable imaging volume 38 for interventional procedures and surgery is a generally conical or frustrum of a cone shaped imaging volume. This is shown in FIG. 3. Referring to FIG. 3, imaging volume is in the shape of a frustrum of a right cone. The imaging region would, of course, be invisible to the eye but for explanation purposes and illustration is shown as a solid volume (as are the imaging regions in the other Figures). It is noted that the imaging region in the Y direction or axis is smaller at top 40 than toward bottom 42, that is, also to assist in obtaining the desired tapered imaging volume, opposed pole faces 44 are inclined pole faces. In addition, return magnetic yoke 30 includes lobes 46 on the sides of poles 28 remote or opposite from inclined pole faces 44. Lobes 46 and inclined pole face 44 may be utilized with the prism shaped imaging volume 16 of superconducting magnet 10 yoke assembly 30 shown in FIG. 1. These simple and versatile design variables are useful in shaping the taper of the imaging volume in the X direction 22, a taper which increases in cross section from the end adjacent opening 48 toward magnet coil 12 remote from the opening.

Referring next to FIG. 4, it is noted that inclined pole faces 144 are shaped or contoured, as is magnetic member 50 positioned at bottom 52 of yoke opening 48. The contouring may be provided in either or both of the Y 24 or Z 18 directions (see FIG. 2). Magnetic member 50 may be made of superconducting material such as NbTi (niobium titanium), or the contour or profile 51 may be approximated or provided by the wound wire 53 of magnet coil 12. Moveable patient support 54 is located just below imaging volume 16, which in this embodiment is a prism shaped volume. The axis of magnet coil 12, indicated generally as 49 (see FIG. 4), is below and parallel to patient support 54. Patient support 54 is moveable in the X22, Y24 and Z18 directions to position patient 56 (shown dotted) such that the region to be imaged, and/or surgery to be performed on, is properly positioned in imaging volume 16. It is noted that the tapered imaging volume is small or narrow at the upper region at the point where surgery begins or needle insertion begins and increases in cross section as the surgeon moves into the body of patient 56.

Referring next to FIG. 5, coil windings 60 may be wound with varying thickness as depicted by contoured surface 64 and which is positioned below patient support 54 and patient 56. In addition, magnetic material such as iron may be used and shaped as member 62. Coil windings 60 also pass through saucer shaped magnetic yoke assembly 66 positioned below and separated from superconducting member 62. Yoke assembly 66 includes contoured surface 68 on the surface remote from contoured surface 64. The shaping of magnetic members 62 and 66 and the positioning of windings 60 are selected to control the current density or pattern, or both, of the imaging side and back side. respectively, of superconducting magnet 10, and provide a magnetic path 70 to optimize magnetic field homogeneity in the imaging volume.

Tapered imagery volumes 16 and 38 do not have to be a true right cone or prism. An oblique or deformed cone or prism is suitable for many interventional procedures. The imaging volumes may be "generally applied" that is they generally increase in cross section in the direction inward toward yoke 30 from opening 48 between pole pieces 28 (see FIGS. 1 and 3). In addition, highly uniform magnetic field homogeneity in imaging volumes 16 and 38 may not be required for certain interventional procedures such that a monotonic field gradient, or gradient in which 5 MT/M (five Milli-Tesla per meter), may be acceptable. A montonic magnetic field gradient is one in which the magnetic field steadily changes or increased without regions of decrease. The increase, may, for example, be a linear function.

Superconducting magnet 10 may be aptly termed a platform magnet in that the magnet forms a platform below patient 56 with tapered imaging volume 16, 38 extending above the patient support 54. This provides substantial open space unencumbered with spacers and supports which are required and extend between the double poleface open architecture MRI designs.

The generation and utilization of a generally tapered imaging volume in a platform superconducting magnet instead of a spherical or cylindrical imaging volume enables considerable design flexibility in the positioning, shaping and contouring of the magnetic members of the magnet and shaping of the current density or pattern to provide an optimized tapered imaging volume homogeneity at minimized cost.

While the present invention has been described with respect to certain prefered embodiments thereof, it is to be understood that numerous variations in the details of construction, the arrangement and combination of parts, and the type of materials used may be made without departing from the spirit and scope of the invention.

What is claimed is:

1. An open architecture superconducting platform magnet suitable for use in magnetic resonance imaging interventional procedures comprising:

a shaped yoke assembly of magnetic material;

a patient support to position a patient with open accessible space spaced from said yoke;

a superconducting coil assembly contiguous to said yoke with its axis beneath said patient support;

said yoke including portions which are shaped to provide a homogeneous magnetic field in an imaging region above said patient support;

said shaped yoke assembly positioned below and to the side of said patient support while leaving unobstructed the space above said patient support to provide said open accessible space; and said superconducting coil assembly and magnetic members shaped and positioned to provide an imaging volume magnetic field above the patient support which is tapered in cross section with the smaller cross section of said tapered cross section being remote from said magnetic coil.

said accessible space above said patient support facilitating said interventional procedures.

2. The superconducting platform magnet of claim 1 wherein the axis of said superconducting coil assembly is parallel to said patient support.

3. The superconducting platform magnet of claim 1 wherein the increase in cross section of said imaging volume is linear.

4. The superconducting platform magnet of claim 3 wherein said imaging volume is conical selected from a circular and rectangular cross section.

5. The superconducting platform magnet of claim 4 wherein said imaging volume is in the shape of a right frustrum conical volume.

6. An open architecture superconducting platform magnet suitable for use in magnetic resonance imaging interventional procedures comprising:
   a shaped yoke assembly of magnetic material;
   a patient support to position a patient with open accessible space spaced from said yoke;
   a superconducting coil assembly contiguous to said yoke with its axis below said patient support;
   said yoke including portions which are shaped to provide a homogeneous magnetic field in an imaging region above said patient support; and
   said superconducting coil assembly and magnetic members shaped and positioned to provide an imaging volume magnetic field which is tapered in cross section with the smaller cross section of said tapered cross section being remote from said magnetic coil;
   wherein a shaped layer of superconducting material is positioned between said yoke and said patient support.

7. The superconducting platform magnet of claim 6 wherein said at least one magnetic coil extends through said yoke and said shaped layer of superconducting material.

8. The superconducting platform magnet of claim 3 wherein said magnetic field in said imaging volume has a monitonic gradient and said imaging volume is conical.

9. The superconducting platform magnet of claim 2 wherein said portions of said yoke which are shaped include surface portions shaped in orthogonal directions.

10. The superconducting platform magnet of claim 9 wherein said yoke includes opposed poles which are shaped to shape the magnetic field in said imaging volume, and said patient support is positioned between said poles.

11. The superconducting platform magnet of claim 10 wherein said yoke is shaped in orthogonal directions to shape the magnetic field in said imaging volume to a generally conical shape.

12. A superconducting platform magnet for magnetic resonance imaging of patients to provide open patient access for interventional procedures comprising:
   a yoke assembly of magnetic material;
   a superconducting magnet coil assembly contiguous to said yoke; and
   a patient support positioned above said superconducting magnet coil assembly to maximize patient access;
   said yoke assembly including shaped surfaces to provide a generally tapered imaging volume in the region above said patient support in which the cross section of said tapered imaging volume increases from the area of said patient support toward said superconducting magnet coil assembly; and
   said yoke assembly is positioned below and to the sides of said patient support while leaving unobstructed the space above said patient support to provide said open patient access;
   said open patient access above said patient support facilitating said interventional procedures.

13. The superconducting platform magnet of claim 12 wherein orthogonal surfaces of said yoke are shaped to improve magnetic field homogeneity in said imaging volume.

14. The superconducting platform magnet of claim 12 wherein said yoke includes poles which are inclined relative to said patient support.

15. The superconducting platform magnet of claim 14 wherein said poles of said yoke are shaped to shape said generally tapered magnetic field in said imaging volume.

16. A superconducting platform magnet for magnetic resonance imaging of patients to provide open patient access for interventional procedures comprising:
   a yoke assembly of magnetic material;
   a superconducting magnet coil assembly contiguous to said yoke;
   a patient support positioned above said superconducting magnet coil assembly to maximize patient access;
   said yoke assembly including shaped surfaces to provide a generally tapered imaging volume in the region above said patient support in which the cross section of said tapered imaging volume increases from the area of said patient support toward said superconducting magnet coil assembly;
   wherein said yoke includes poles which are inclined relative to said patient support;
   wherein said poles of said yoke are shaped to shape said generally tapered magnetic field in said imaging volume; and
   wherein a magnetic member is provided parallel to said patient support dividing said yoke into an upper and a lower cavity, and said superconducting magnet coil assembly includes a coil wound about said magnetic member with the axis of said superconducting magnet coil assembly positioned parallel to and below said patient support.

17. The superconducting platform magnet of claim 16 wherein said magnetic member is superconducting material.

18. The superconducting platform magnet of claim 17 wherein said tapered imaging volume has a cross section selected from circular and rectangular and in which said cross section decreases in a direction away from said magnet coil assembly.

19. The superconducting platform magnet of claim 18 wherein said magnetic field in said imaging volume has a monitonic gradient.

20. The superconducting magnet of claim 15 wherein said patient support is positioned adjacent and between said poles.

* * * * *